(12) United States Patent
Loiselet

(10) Patent No.: US 8,647,927 B2
(45) Date of Patent: Feb. 11, 2014

(54) MICROWAVE CIRCUIT PACKAGE

(75) Inventor: Emmanuel Loiselet, Elancourt (FR)

(73) Assignee: Thales Holdings UK PLC, Surrey (GB)

( * ) Notice: Subject to any disclaimer, the term of this patent is extended or adjusted under 35 U.S.C. 154(b) by 360 days.

(21) Appl. No.: 13/015,010

(22) Filed: Jan. 27, 2011

(65) Prior Publication Data
US 2011/0210431 A1 Sep. 1, 2011

(30) Foreign Application Priority Data
Jan. 27, 2010 (GB) .................................. 1001332.4

(51) Int. Cl.
H01L 21/00 (2006.01)
(52) U.S. Cl.
USPC ........................................................ 438/121
(58) Field of Classification Search
USPC ................................................. 438/121, 612
See application file for complete search history.

(56) References Cited

U.S. PATENT DOCUMENTS

| 5,866,942 | A | 2/1999 | Suzuki et al. |
| 2001/0048151 | A1 | 12/2001 | Chun |
| 2008/0151512 | A1 | 6/2008 | Johnson |
| 2010/0167559 | A1* | 7/2010 | Cavegn et al. .................. 439/65 |

OTHER PUBLICATIONS

Great Britain Search Report dated Jun. 17, 2010 for GB 1001332.4.
Great Britain Search Report dated Jun. 17, 2010 in the GB1001332.4 Patent Application.
Parital European Search Report isued Jul. 19, 2012 in EP Application No. 11 25 0078.

* cited by examiner

Primary Examiner — Bradley K Smith
(74) Attorney, Agent, or Firm — Stroock & Stroock & Lavan LLP

(57) ABSTRACT

A microwave circuit package having a ball grid array, BGA, soldered on to a planar major surface of a metal housing of the package for the electrical connection of the ports of the microwave circuit through RF signal paths to an adjacent electrical device. Each of the RF signal paths comprises a pin electrically connected to a respective port of the microwave circuit package, projecting normally through an opening in the said major surface from which it is electrically insulated, and soldered to a ball of the BGA; the pin and the surrounding balls of the BGA, which are soldered to the metal housing, constituting a coaxial RF signal path.

11 Claims, 2 Drawing Sheets

MICROWAVE CIRCUIT PACKAGE

This application claims priority to GB Patent Application No. 1001332.4, filed Jan. 27, 2010, the entire contents of which are incorporated herein.

This invention relates to a microwave circuit package and to a method of manufacture of a microwave circuit package. It is particularly applicable to a microwave circulator or isolator, but it could be applied to any microwave circuit such as a packaged integrated circuit. Microwave circulators, sometimes also known as isolators (when one port is loaded with an RF load), are waveguide components having a number of terminals, typically three or four, so arranged that energy entering one terminal is transmitted to the next adjacent terminal in a particular rotational direction. Radio frequency, RF, circulators are useful for example in transmitting and receiving devices.

Existing microwave circulators typically comprise a metallic housing containing an RF stripline, which defines waveguides leading to the three or four terminals or ports. The wave guides interface with a permanent magnet which causes the RF signals to be transmitted between the ports in the predetermined rotational direction. Such circulator/isolator devices are useful in a bandwidth of 4-20 GHz for active antennae on radars, for example.

Existing circulators use microstrip lines for connection to external devices, these lines extending in the plane of the RF stripline, i.e. in the X or Y axis. These transmission lines are not easy to shield, and special care needs to be taken in the design of RF devices incorporating these circulator components. Embedded or buried RF transitions for surface mount device, SMD, circulators exist, but these are difficult to solder at the interface between the component and a multilayer board.

There is also a desire for the manufacture of RF devices incorporating circulators to be more fully automated and to be fully compatible with a PCB mass production process.

Further, it is important for the microwave circulator to have its impedance correctly matched, so the transition between its ports and the external devices must be such that the impedance can be controlled to within a desired tolerance. Typical output impedances at these transitions are at 50Ω, preferably within a 10Ω tolerance, i.e. between 40 and 60Ω.

The present invention provides a microwave circuit package having a ball grid array, BGA, soldered on to a planar major surface of a metal housing of the package for the electrical connection of the ports of the microwave circuit through RF signal paths to an adjacent electrical device.

Preferably, each of the RF signal paths comprises a pin electrically connected to a respective port of the circulator, projecting normally through an opening in the said major surface from which it is electrically insulated, and soldered to a ball of the BGA; the pin and the surrounding balls of the BGA, which are soldered to the metal housing, constituting a coaxial RF signal path.

Further, the invention provides a method of manufacture of a microwave circuit package having a ball grid array, BGA, soldered onto a planar major surface of a metal housing of the package for the electrical connection of the ports of the microwave circuit through RF signal paths to an adjacent electrical device, in which each of the RF signal paths comprises a pin electrically connected to a respective port of the microwave circuit, projecting normally through an opening in the said major surface from which it is electrically insulated, and soldered to a ball of the BGA; the pin and the surrounding balls of the BGA, which are soldered to the metal housing, constituting a coaxial RF signal path; each RF signal path further comprising a plastics insulator plug fitted sealingly into the opening in the metal housing to form a fluid-tight seal, the plug having an axial bore through which extends the pin with a fluid-tight seal therebetween; the pin having a central portion narrower than the external end of the pin that is soldered to the ball, and a conical transition surface between the central portion and the external end;

the method comprising, for each port, fitting the insulator plug and pin into the corresponding opening in the metal housing, applying axial pressure to the external end of each pin, to cause the conical transition surface to apply a radial force to the inner wall of the bore of the plastics plug to enlarge the plug bore through plastic deformation, until the pin has moved inwardly sufficiently that the pins external end is substantially flush with the major surface; and soldering the BGA to the pins and to the major surface with the balls substantially coplanar.

The invention allows the use of ball grid array technology to be applicable to microwave circulators, making it completely compatible with PCB mass production processes. The use of pins to form an interconnection in the Z axis of the stripline of the microwave circulator, i.e. normal to the plane of the stripline, makes the structure more compact. This compactness also is of benefit since the distance between the pin and the edges of the opening through the major surface of the metal housing of the circulator can be made sufficiently small to correspond with the spacing between adjacent balls of a BGA, for satisfactory compatibility. The adjustment during manufacture of the axial position of the pin relative to the metal housing allows for the assembly to be brought into connection with the BGA without disturbing the alignment of the balls of the BGA in a coplanar array. The invention also allows for satisfactory shielding of the signal path through the pin, by facilitating a coaxial arrangement at the transition: a number of the balls of the BGA may be used to contact the major surface of the metal housing, which is earthed, to surround the signal path which is through the pin and one of the balls of the BGA.

Further, the invention allows the manufacturing process to be compatible with the RF tuning of the ports of the microwave circulator, since a predetermined effective impedance at the transition is provided reliably in accordance with the invention. Thus the interconnection between the pin and the stripline at the port may be tuned by the application of material such as iron powder in silicone, and this tuning may be done before the circulator is assembled to the BGA. This makes the manufacturing process quicker and simpler.

By grounding the RF pin transition, the assembled BGA devices are not susceptible to electromagnetic interference.

The assembled BGA circulator device is easy to solder onto an RF printed circuit board, without the need for any locating tooling, whilst taking advantage of the BGA self alignment properties.

In order that the invention may be better understood, a preferred embodiment will now be described, by way of example, with reference to the accompanying schematic drawings, in which.

Figure 1:
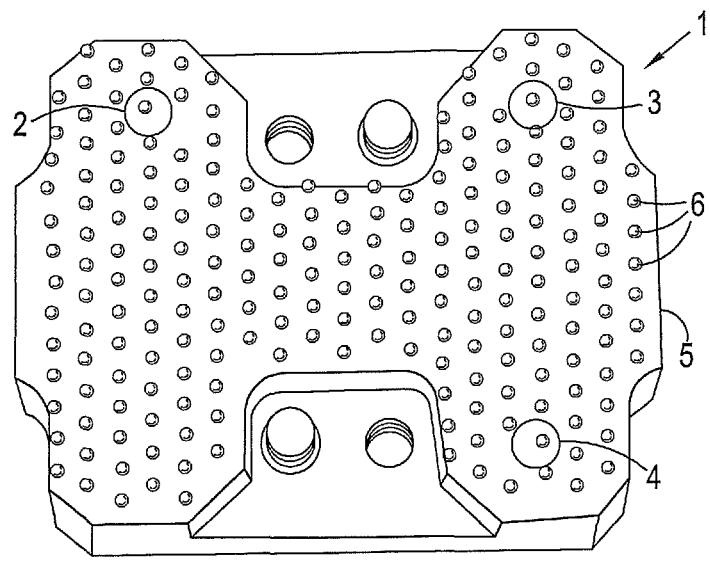
FIG. 1 is a plan view in perspective of a microwave circulator applied to a ball grid array of solder balls, in accordance with the preferred embodiment of the invention.
Figure 2:
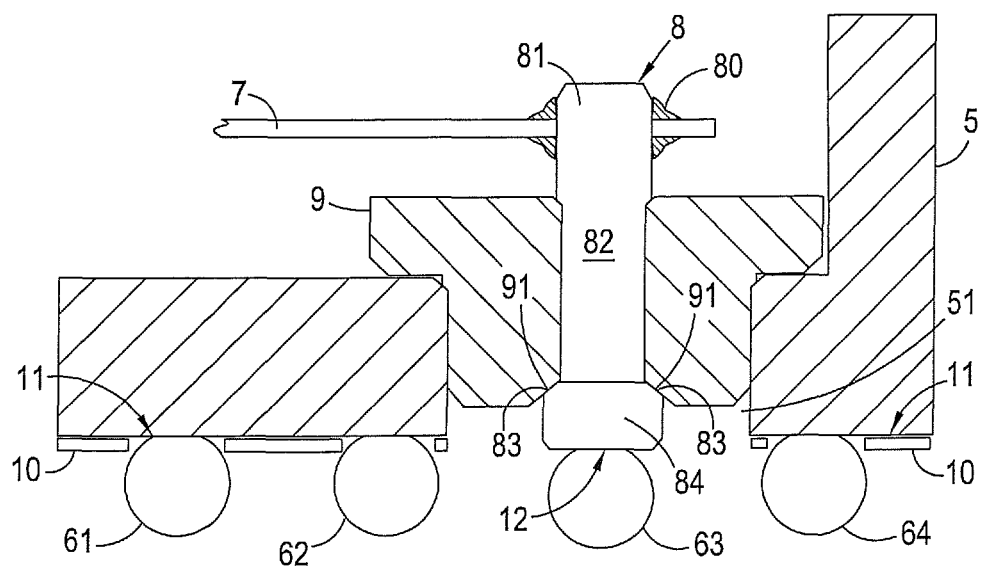
FIG. 2 is an enlarged partial sectional view through part of the device of FIG. 1.

With reference to FIG. 1, a microwave circulator 1 has a steel alloy housing 5 for an RF air stripline 7 (shown in FIG. 2). The housing forms a frame for the circulator and is usually constructed from steel alloy because of the ferrites embedded into the device. Accordingly, the housing 5 is of substantially great density, and the solder balls of a ball grid array, BGA 6 need to be compatible with the mass of the circulator during the BGA balling process. Such balls are typically of a lead-tin alloy such as Pb90-Sn10, which has a melting point of 300° C. Even at oven temperatures of 200° C. these non-fusible balls will not be deflected too much by the mass of the circulator. Eutectic solder paste is deposited through gaps in a solder resistant mask 10, and the solder balls are applied to that paste deposit. When the solder paste melts, the balls stay in place because of the barrier made by the solder resistant mask 10 through a surface tension effect.

The circulator 1 has three ports 2, 3, 4 at which an RF transition is made between waveguides on stripline 7 and respective balls of the BGA, for soldering to establish an electrical connection to external components (not shown).

One of these transitions is shown enlarged in FIG. 2. The metal housing 5 has a generally planar major surface 11 which is generally silver plated and then coated with the solder resistant mask 10 for soldering the surface to some of the balls of the BGA. A circular opening 51 through the major surface is plugged with a plastics plug 9, typically of PTFE, which is a press fit into the frame, forming a fluid-tight seal. The plug 9 has a generally cylindrical configuration, with an enlarged head for contacting the inner surface of the housing 5 in a peripheral region around the opening 51. The plug 9 has a cylindrical bore which is chamfered at each end: at the outer end this chamfer forms a conical surface 91. The plug 9 fills the opening 51 to a depth of approximately three quarters in the axial direction, leaving an air gap between the plug and the plane of the major surface 11.

The RF signal path through the transition is formed by an RF pin 8 formed of brass or copper beryllium alloy coated with gold or silver. The pin is rotationally symmetric, comprising a main portion 82, and an outer end portion 84 which is wider than the main portion 82. A conical surface 83 forms the transition between the main portion 82 and the outer end portion 84, so that the pin tapers outwardly in the outward axial direction. The tapering angle of the conical portion 83 is substantially the same as the angle of the chamfer 91 of the plastics plug 9, so that the pin mates with the plug and the tapering surfaces facilitate a camming action. The pin extends fully through the bore of the plastics plug, to form a fluid-tight seal.

A solder joint 80 is formed at the junction 81 between the pin 82 and the RF stripline 7, generally with high melting point (230° C.) solder paste.

Loaded resin, or other appropriate material (not shown) is added on the top of the pin 82, to provide tuning of the RF transition prior to the assembly of the frame 5 with the BGA solder bumps. The tuning material could be a mix of iron powder and silicone.

Balls 61, 62 and 64 of the BGA 6 of FIG. 1 are soldered onto the major surface 11, using the solder paste (not represented). The positioning of the balls 61, 62, 64 onto the surface 11 is done according to the clearances in the solder resistant mask 10. Ball 63 of the BGA is soldered onto a planar end surface 12 of the pin 8, preferably using a layer of solder paste (not shown) on the pin. The end surface 12 of the pin 8 is substantially flush with the major surface 11 of the housing 5, so that the balls 61 to 64 are substantially coplanar.

Figure 3:
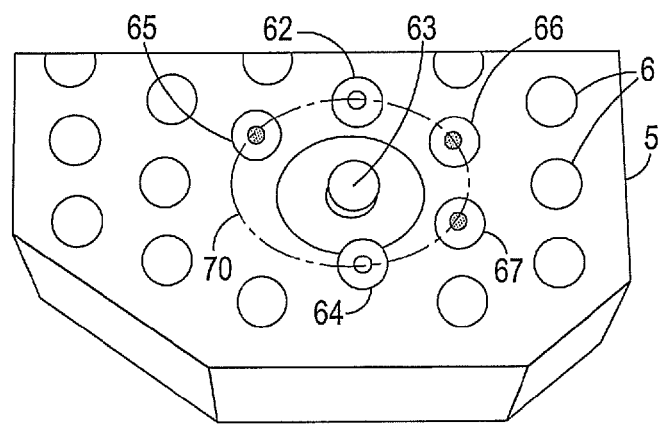
FIG. 3 is a partial plan view in perspective of the device of FIG. 1 illustrating a coaxial transition.

By grounding the housing 5, this transition is effectively a pseudo coaxial line, with the signal path through the pin 8 and solder ball 63. The effective impedance of this coaxial line at the transition is controlled to be substantially 50Ω, within the tolerance of 40 to 60Ω. This impedance is predetermined with reference to the dielectric constant of the plastics plug 9, the dielectric constant of the air in the air gap around the pin, and the distances between the surfaces of the pin and the adjacent surfaces of the housing 5 and the balls 62, 63 and 64, as well as the other balls (shown in FIG. 3) surrounding the transition. As shown in FIG. 3, the central ball 63 is surrounded in a ring 70 by five solder balls 62, 64, 65, 66 and 67, at substantially the same radius from the ball 63. In this example, the ball grid array has balls of 0.4 mm (400 microns) in diameter, the array having a pitch of 0.8 mm with a 0.4 mm offset between rows, forming a diagonal grid. Accordingly, the distance between balls 62 and 64 is 1.6 mm.

RF grounding balls 65, 66 and 67 are not exactly on a diameter 1.6 mm (like RF grounding balls 62 and 63). Due to the grid offset, balls 65, 66 and 67 are on a diameter 2×SQRT $(0.8^2+0.4^2)$=1.79 mm. On the RF point of view, the impedance of the RF transition in air is driven by the shortest distance between the RF ball 63 and grounding balls 62 and 64. Although balls 65, 66 and 67 are quite distant, and their influence on the line impedance is low, nevertheless their influence on shielding the RF signal is high.

Computer modelling applications are available, and need not be described here, for the calculation of the impedance between regularly-shaped conductors with specific intervening dielectric material.

The fluid-tight seals at this transition should be sufficient to keep water out, to avoid corrosion. For circulators, it is not generally required to have an hermetic seal.

The surface of the pin 8 should be smooth, since the RF signal travels on its skin, and since trapped air, which would have a different dielectric constant, should not be tolerated around the pin.

It is advantageous, in this example, that the external end 84 of the pin should have substantially the same diameter as that of the ball 63. The diameters need not be exactly the same, and for example the diameter of the pin 84 could be in the range of 0.9 to 1.2 times the diameter of the ball. There is then a sufficient radial air gap between the pin 84 and the housing 5, to keep the impedance as high as 50Ω. At the same time, the arrangement of the pin and the opening 51 is sufficiently compact to be compatible with the expected spacing of the balls of the BGA.

The manufacturing method for the circulator 1 is as follows. For each of the ports 2, 3 and 4, a pin 8 is soldered to the stripline 7 and the port is RF tuned just before the BGA balling process. A plug 9 is push fit over each pin 8. The stripline 7 is then located into the housing 5, by pushing the plugs 9 into the openings 51. (As an alternative, the plugs 9 could be inserted into the openings 51 first, and the stripline 7 could be mounted into the plugs 9.) Axial pressure is then applied to the end 84 of each pin inwardly to urge the pin to a position at which the end surface 12 is flush with the major surface 11 of the housing. This may be achieved by separate tooling, acting on the exposed pins. Alternatively, it could be achieved by the BGA itself, as part of the mounting of the BGA onto the housing 5. When axial pressure is exerted on the end surface 12 of the pin 8, the camming action of the mating conical surfaces 91 and 83 converts the axial force to a radial force urging open the bore through the plug 8. This allows the pin to be pushed axially further into the plug bore. Since the plastics material, which in this case is PTFE, is deformable plastically but not resiliently, the plug assumes a distorted shape and keeps that shape once the pressure is relieved. Thus there is no continued reaction force on the ball 63, once the assembly has been made.

The simplified assembly process is as follows:

Step 0: Put a lower ferrite into the circulator frame

Step 1: Push fit RF pin 8 into PTFE insulator 9.

Step 2: Push fit Step 1 assembly into the circulator frame 5.

Step 3: Place the RF stripline 7 onto the RF Pin 8.

Step 4: Solder the RF pin 8 onto the RF stripline 7 with high melting point solder paste (melting point typically 230° C.), to be sure that the solder joint 80 will not remelt during the balling process (see step 11).

Step 5: Put an upper ferrite into the circulator Frame

Step 6: Put a magnet into the circulator Frame

Step 7: Check that the RF pin lower face 12 is flush with 11, and push pin 8 upward if needed.

Step 8: Test the circulator performance (before the balling process) with the specific mattress that re-creates the solder balls effect.

Step 9: Tune the device with material to adapt the RF port performances.

Step 10: Put the lid onto the tuned circulator.

Step 11: Put the non fusible solder balls onto the circulator Frame using Eutectic solder paste (typically 200° C.), in what is called the BGA balling process.

Step 12: Test the circulator performance (after the balling process).

In this example, the diameter of the opening 51 is 1.17 mm. The principal diameter of the plug 9, within the opening, is 1.19 mm to give it a push fit. The inner diameter of the plug is 0.33 mm, and the outer diameter of the pin is 0.35 mm throughout its main portion 82. The diameter of the outer end portion 84 of the pin is 0.45 mm, and the axial length of this portion is 0.25 mm, the overall length of the pin being 1.4 mm. During assembly, the axial projection of the end surface 12 of the pin beyond the major surface 11 of the housing 5 is typically 0.03 mm plus or minus 0.02 mm, to allow for a slight axial movement during assembly to reduce this projection to zero.

We have found that the RF performance of the preferred embodiment of the invention is fully satisfactory. The transmission loss at the transition is approximately 0.35 dB for one magnet in the circulator (3 port) and 0.5 dB for two magnets (circulator 4-port), this transmission loss being similar to that which can be achieved with a "drop in" circulator design such as a packaged drop in circulator supplied by MESL Microwave Limited, Lochend Industrial Estate, Newbridge, Edinburgh, EH28 8LP, Scotland. The RF pin transition design does not harm the RF performance of the circulator.

Figure 4:
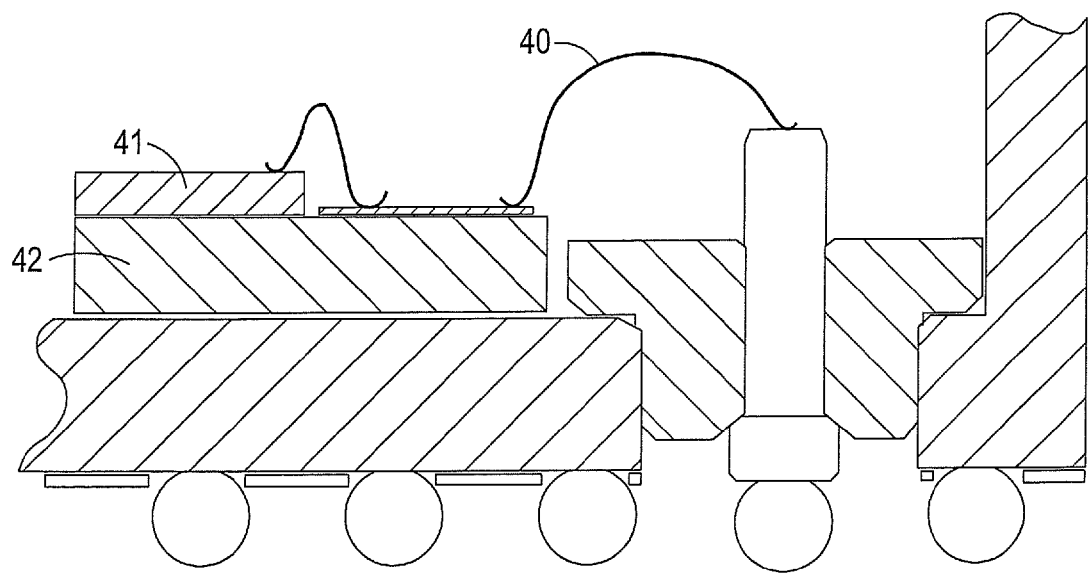
FIG. 4 illustrates an alternative microwave circuit package embodying the invention.

An alternative microwave circuit package embodying the invention is shown in FIG. 4, which corresponds to FIG. 2 except that a microwave integrated circuit chip 41 on an alumina substrate 42 is bonded to the alumina surface and at 40 to the pin 8.

The invention claimed is:

1. A microwave circuit package having a ball grid array, BGA, soldered on to a planar major surface of a metal housing of the package for the electrical connection of the ports of the microwave circuit through RF signal paths to an adjacent electrical device, wherein each of the RF signal paths comprises a pin electrically connected to a respective port of the microwave circuit, projecting normally through an opening in said major surface from which it is electrically insulated, and soldered to a ball of the BGA, and wherein the pin and the surrounding balls of the BGA, which are soldered to the metal housing, constitute a coaxial RF signal path.

2. The microwave circuit package according to claim 1, in which the impedance of each RF signal path at the BGA is in the range of 40 to 60Ω.

3. The microwave circuit package according to claim 1, wherein the ball connected to the pin is surrounded at substantially equal radii by five balls of the BGA.

4. The microwave circuit package according to claim 1, in which the pin is connected at its inner end to a signal path on a stripline, within the housing.

5. The microwave circuit package according to claim 1, in which the pin has an outer cylindrical end of substantially the same diameter as the ball to which it is soldered.

6. The microwave circuit package according to claim 1, comprising a plastics insulator plug shaped to fit sealingly into the opening in the major surface of the metal housing, forming a fluid-tight seal, the plug having an axial bore through which extends the pin with a fluid-tight seal therebetween.

7. The microwave circuit package according to claim 6, wherein the pin has a central portion narrower than the external end of the pin that is soldered to the ball, and a conical transition surface between the central portion and the external end, such that inward axial pressure on the pin enlarges the plug bore through plastic deformation.

8. The microwave circuit package according to claim 7, in which the external end of the pin is substantially flush with the major surface of the metal housing so that both engage the BGA with the balls of the BGA coplanar.

9. The microwave circuit package according to claim 1, in which the microwave circuit is a circulator or isolator.

10. A method of manufacture of a microwave circuit package having a ball grid array, BGA, soldered onto a planar major surface of a metal housing of the package for the electrical connection of the ports of the microwave circuit through RF signal paths to an adjacent electrical device, in which each of the RF signal paths comprises a pin electrically connected to a respective port of the microwave circuit, projecting normally through an opening in the said major surface from which it is electrically insulated, and soldered to a ball of the BGA; the pin and the surrounding balls of the BGA, which are soldered to the metal housing, constituting a coaxial RF signal path; each RF signal path further comprising a plastics insulator plug fitted sealingly into the opening in the metal housing to form a fluid-tight seal, the plug having an axial bore through which extends the pin with a fluid-tight seal therebetween; the pin having a central portion narrower than the external end of the pin that is soldered to the ball, and a conical transition surface between the central portion and the external end; the method comprising, for each port, fitting the insulator plug and pin into the corresponding opening in the metal housing, applying axial pressure to the external end of each pin, to cause the conical transition surface to apply a radial force to the inner wall of the bore of the plastics plug to enlarge the plug bore through plastic deformation, until the pin has moved inwardly sufficiently that the pins external end is substantially flush with the major surface; and soldering the BGA to the pins and to the major surface with the balls substantially coplanar.

11. The method according to claim 10, in which the microwave circuit is a circulator or isolator.

* * * * *